(12) United States Patent
Ito

(10) Patent No.: US 11,513,161 B2
(45) Date of Patent: Nov. 29, 2022

(54) METHOD OF DETECTING ABNORMALITY AND INFORMATION PROCESSING APPARATUS

(71) Applicant: FUJITSU LIMITED, Kawasaki (JP)

(72) Inventor: Toshio Ito, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/163,598

(22) Filed: Feb. 1, 2021

(65) Prior Publication Data

US 2021/0311128 A1    Oct. 7, 2021

(30) Foreign Application Priority Data

Apr. 2, 2020 (JP) .............................. JP2020-067073

(51) Int. Cl.
```
G01R 31/392      (2019.01)
G01R 31/36       (2020.01)
G01R 31/382      (2019.01)
G01R 31/367      (2019.01)
```
(52) U.S. Cl.
CPC ......... *G01R 31/392* (2019.01); *G01R 31/367* (2019.01); *G01R 31/3648* (2013.01); *G01R 31/382* (2019.01)

(58) Field of Classification Search
None
See application file for complete search history.

(56) References Cited

U.S. PATENT DOCUMENTS

| | | | | |
|---|---|---|---|---|
| 2001/0048226 | A1 | 12/2001 | Nada | |
| 2012/0135327 | A1* | 5/2012 | Jeong | H01M 8/04589 429/432 |
| 2013/0093384 | A1* | 4/2013 | Nyu | G01R 31/382 320/107 |
| 2015/0160304 | A1* | 6/2015 | Nam | B60L 3/12 702/63 |

FOREIGN PATENT DOCUMENTS

| | | |
|---|---|---|
| JP | 2001-329884 A | 11/2001 |
| JP | 2011-145105 A | 7/2011 |

* cited by examiner

*Primary Examiner* — Jas A Sanghera
(74) *Attorney, Agent, or Firm* — Xsensus LLP

(57) ABSTRACT

A method of detecting abnormality includes acquiring, by a computer, operation log data that include measured data of a plurality of items related to an operation of a mobile object that is electrically driven; and determining, based on the operation log data, that an abnormality occurs in the mobile object when measured data of two items among the plurality of items do not satisfy a linear relationship, the two items having the linear relationship in a normal state of the mobile object.

15 Claims, 14 Drawing Sheets

FIG. 3

| ITEM NUMBER | MONITORING TARGET ITEMS | THRESHOLD |
|---|---|---|
| 1 | $j_1, j_2$ | $\delta_{j1, j2}$ |
| 2 | $j_1, j_3$ | $\delta_{j1, j3}$ |
| 3 | $j_2, j_3$ | $\delta_{j2, j3}$ |
| 4 | $j_2, j_4$ | $\delta_{j2, j4}$ |
| 5 | $j_4, j_5$ | $\delta_{j4, j5}$ |
| ... | ... | ... |

142

RELATED ART

METHOD OF DETECTING ABNORMALITY AND INFORMATION PROCESSING APPARATUS

CROSS-REFERENCE TO RELATED APPLICATION

This application is based upon and claims the benefit of priority of the prior Japanese Patent Application No. 2020-067073, filed on Apr. 2, 2020, the entire contents of which are incorporated herein by reference.

FIELD

The embodiments discussed herein are related to a method of detecting abnormality and an information processing apparatus.

BACKGROUND

Electric vehicles (EV) that run with battery power have been distributed in the market. Since an EV may not continue to run and may stop on the road when the battery malfunctions during the running, there has been a demand for detecting an abnormality of the battery at an early stage before the malfunction of the battery. When the abnormality of the battery is detectable at an early stage, the battery may be replaced at a repair shop before the battery comes to a malfunction.

Here, an example of the related art will be described which detects an abnormality of a battery by using an output voltage from the battery. FIG. 9 is a view illustrating a battery system of the prior art. In FIG. 9, a battery system 5 includes batteries 1a and 2a and voltmeters 1b and 2b. The voltmeter 1b measures the voltage $V_1$ of the battery 1a. The voltmeter 2b measures the voltage $V_2$ of the battery 2a.

FIG. 10 is a view (part 1) illustrating an example of an abnormality detecting method according to the related art. The graph G1 illustrated in FIG. 10 represents a relationship between time and voltage. In the graph G1, the horizontal axis corresponds to time, and the vertical axis corresponds to measured values of voltages. In the abnormality detecting method of the related art, when a measured value of a voltage is equal to or higher than a threshold $Th_1$ and less than a threshold $Th_2$, it is determined that the battery is normal. Meanwhile, when a measured value of a voltage is less than the threshold $Th_1$ and equal to or higher than the threshold $Th_2$, an abnormality is detected.

For example, when a measured value of the voltmeter 1b is less than the threshold $Th_1$ and equal to or higher than the threshold $Th_2$, the battery system 5 detects an abnormality of the battery 1a. When a measured value of the voltmeter 2b is less than the threshold $Th_1$ and equal to or higher than the threshold $Th_2$, the battery system 5 detects an abnormality of the battery 2a.

FIG. 11 is a view (part 2) illustrating an example of an abnormality detecting method during a charging according to the related art. The graph G2 illustrated in FIG. 11 represents a relationship between time and a differential voltage. A differential voltage $\Delta V$ represents a voltage obtained by subtracting a voltage $V(t_{i-1})$ at a timing $t_{i-1}$ from a voltage $V(t_i)$ at a timing $t_i$. In the graph G2, the horizontal axis corresponds to time, and the vertical axis corresponds to a differential voltage. When the differential voltage is equal to or higher than a threshold $Th_3$, it is determined that the battery is normal. Meanwhile, when the differential voltage is less than the threshold value $Th_3$, an abnormality (overcharge) is detected.

For example, the battery system 5 calculates a differential voltage based on a measured value of a voltage measured by the voltmeter 1b at each timing, and detects an abnormality of the battery 1a when the differential voltage becomes less than the threshold $Th_3$. The battery system 5 calculates a differential voltage based on a measured value of a voltage measured by the voltmeter 2b at each timing, and detects an abnormality of the battery 2a when the differential voltage becomes less than the threshold $Th_3$.

Related technologies are disclosed in, for example, Japanese Laid-Open Patent Publication No. 2011-145105.

SUMMARY

According to an aspect of the embodiments, a method of detecting abnormality includes: acquiring, by a computer, operation log data that include measured data of a plurality of items related to an operation of a mobile object that is electrically driven; and determining, based on the operation log data, that an abnormality occurs in the mobile object when measured data of two items among the plurality of items do not satisfy a linear relationship, the two items having the linear relationship in a normal state of the mobile object.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 3 is a view illustrating an example of a data structure of a monitoring target item table;

DESCRIPTION OF EMBODIMENTS

When the detection of abnormality is performed using time-series data for only one item such as an output voltage from the battery as in the related art that has been described, the accuracy may be deteriorated which is problematic.

Here, examples of physical characteristics of an EV will be described. Multiple items which may be measured from an EV as physical characteristics of the EV may have a linear relationship with each other in a normal state, and the original linearity of the multiple items may largely collapse in an abnormal state.

Figure 12:
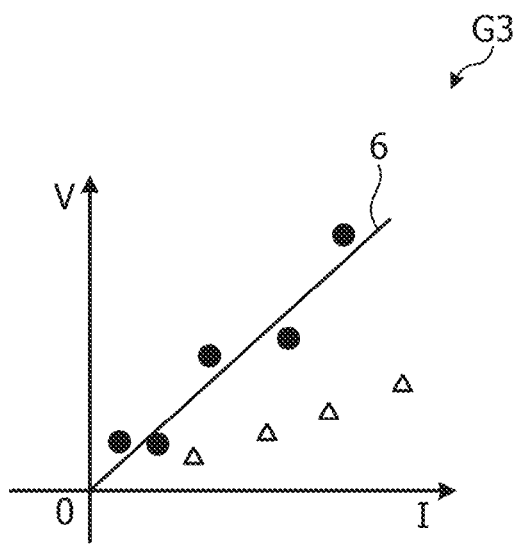
FIG. 12 is a view (part 1) illustrating physical characteristics of an electric vehicle (EV)

FIG. 12 is a view (part 1) illustrating physical characteristics of the EV. The graph G3 illustrated in FIG. 12 represents a relationship between current and a voltage of a battery. In the graph G3, the vertical axis corresponds to a measured value of the voltage. In the graph G3, the horizontal axis corresponds to a measured value of the current. The circles represented in the graph G3 of FIG. 12 correspond to data in the normal state. Each triangle corresponds to data in the abnormal state.

In the normal state, the voltage and the current of the battery have a linear relationship, and various voltage and current values are observed over a wide range. The line segment 6 indicates a linear regression model based on the data in the normal state. The measured values of voltage and current have less noise, and have a small square error with the linear regression model.

Figure 13:
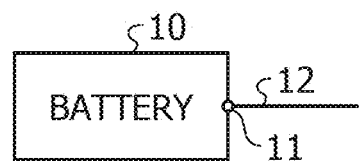
FIG. 13 is a view illustrating an abnormality caused from an attachment to a connection portion.

FIG. 13 is a view illustrating an abnormality caused by an attachment to a connection portion. In FIG. 13, a wiring 12 is connected to a battery 10 of an EV via a connection portion 11. When the connection portion 11 is deteriorated and an attachment is attached, the resistance of the connection portion 11 changes and the original linearity largely collapses. For example, the data in the normal state illustrated in FIG. 12 becomes data in the abnormal state.

While an abnormality of a battery is detectable by focusing on the combination of current and voltage as described above, the abnormality described in FIG. 13 may not be detected from the time-series data for only one item such as the output voltage from the battery.

Figure 9:
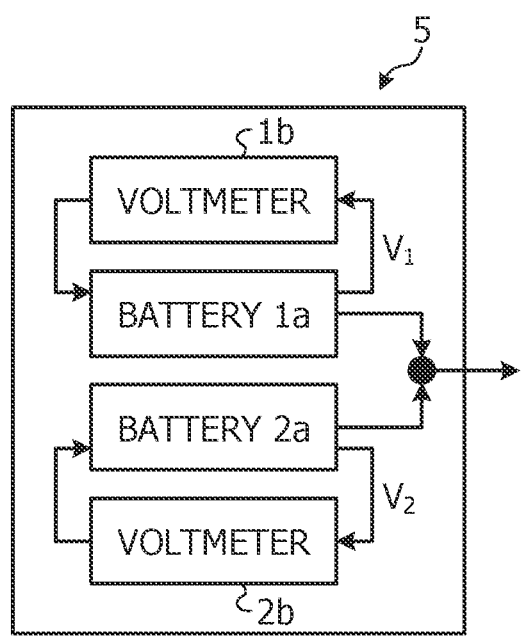
FIG. 9 is a view illustrating a battery system according to related art.
Figure 10:
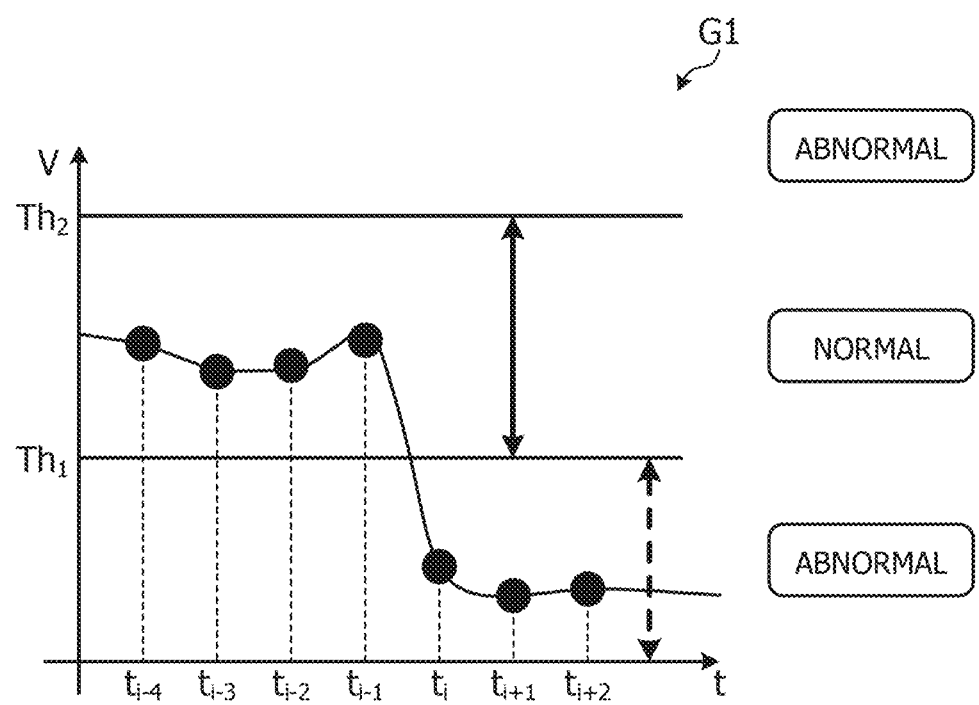
FIG. 10 is a view (part 1) illustrating an example of an abnormality detecting method according to related art.
Figure 11:
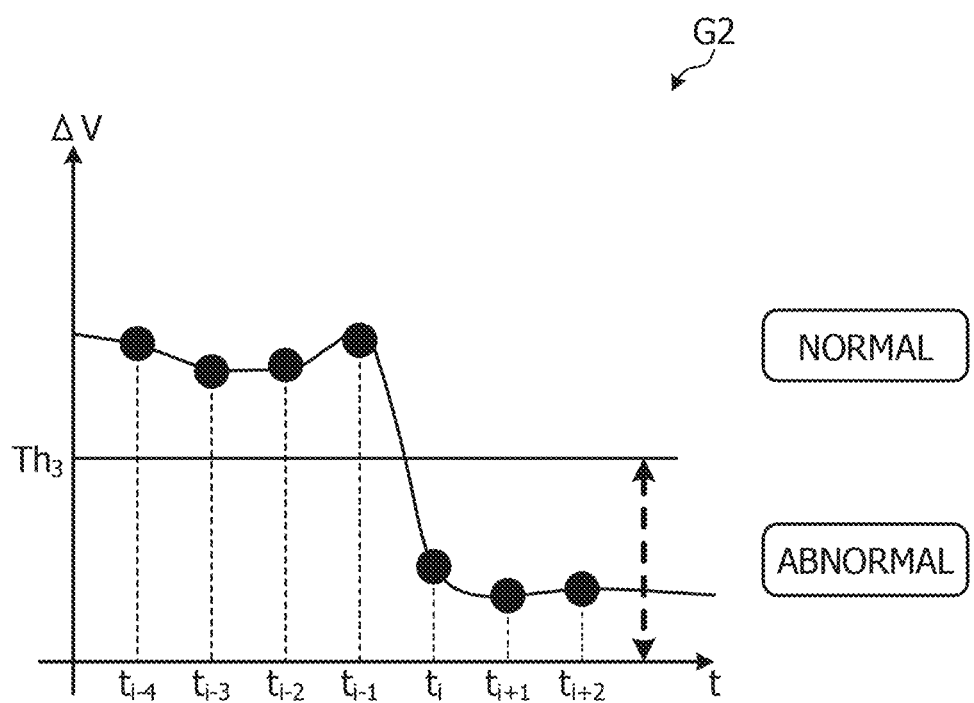
FIG. 11 is a view (part 2) illustrating an example of the abnormality detecting method during a charging according to related art.
Figure 14:
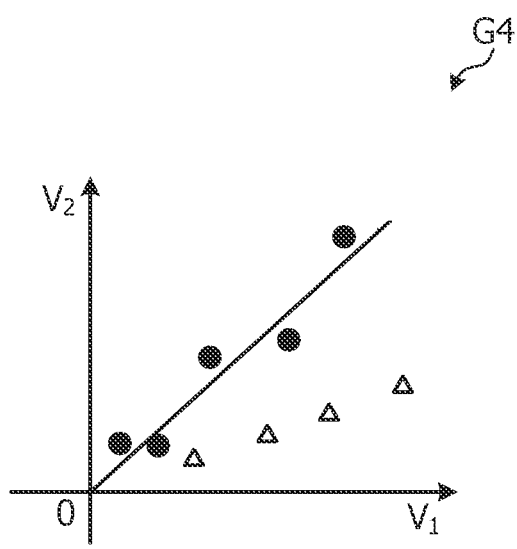
FIG. 14 is a view (part 2) illustrating physical characteristics of an electric vehicle (EV).

FIG. 14 is a view (part 2) illustrating physical characteristics of the EV. The graph G4 illustrated in FIG. 14 represents a relationship between a voltage $V_1$ of the battery $1a$ and a voltage $V_2$ of the battery $2a$ in the battery system 5 described in FIG. 9. In the battery system 5, it is assumed that the same control is conducted on the batteries $1a$ and $2a$. The circles represented in the graph G4 of FIG. 14 correspond to data in the normal state. Each triangle corresponds to data in the abnormal state.

As represented in the graph G4 of FIG. 14, the measured values of voltage for the batteries $1a$ and $2a$ are $V_1 \approx V_2$ in the normal state. However, when an abnormality occurs in the battery $1a$, the measured values may become $V_1 \neq V_2$. Thus, while an abnormality of a battery may be detected focusing on the combination of voltages of the different batteries, the abnormality described in FIG. 14 may not be detected from the time-series data for only one item such as the output voltage from each battery.

Hereinafter, embodiments of an abnormality detection program, an abnormality detecting method, and an abnormality detecting device according to the present disclosure will be described in detail with reference to the accompanying drawings. Meanwhile, the present disclosure is not limited to the embodiments.

EMBODIMENTS

An abnormality detecting device according to an embodiment performs a process at the time of a learning and a process at the time of an evaluation. First, the process performed by the abnormality detecting device at the time of a learning will be described. The abnormality detecting device acquires data D in the normal state from an EV having a battery in the normal state. The data in the normal state are referred to as the data D, and defined by an equation (1). As represented in the equation (1), the data D include multiple measured values di that are arranged in a time-series manner (i=1, 2, 3, . . . , n). The "n" is the number of measured values.

Equation (1)

$$D = \{d_1, d_2, \ldots, d_n\} \quad (1)$$

A measured value di at a certain timing that is included in the data D is defined by an equation (2). As represented in the equation (2), the measured value di includes measured values $d_{i,1}, \ldots, D_{i,m\sim}$ of multiple items at a certain timing. Meanwhile, "m~" in the descriptions herein corresponds to the symbol indicated by "a" in the equation (2). The "m~" refers to the number of items.

Equation (2)

$$d_i = \left( d_{i,1}, d_{i,2}, \ldots, d_{i,\underset{a}{\tilde{m}}} \right) \quad (2)$$

For example, the multiple items included in the measured value di represented by the equation (2) include items related to the running of the EV, such as a voltage, current, an odometer, an engine rotation speed and others. Further, when the same EV is provided with multiple batteries, and the same control is conducted on the multiple batteries, the multiple items may include voltages of the respective batteries.

The abnormality detecting device selects two items ($1 \leq j_1$, $<j_2$, $\leq m\sim$) from the entire items of the data D. The abnormality detecting device calculates a correlation between $d_{j1}$ and $d_{j2}$ for the two selected items, and adopts the two items with a correlation value equal to or higher than a predetermined correlation value, as "monitoring target items." Further, the abnormality detecting device sets a threshold $\delta_{j1,j2} > 0$ based on the correlation value of the monitoring target items.

While changing a combination of two items to be selected from the entire items, the abnormality detecting device repeats the process described above for all combinations. A threshold is set for each monitoring target item based on a correlation value of the monitoring target item. Multiple monitoring items are specified by the threshold. The relationship between measured values of monitoring target items is linear in the normal state.

Subsequently, the process performed by the abnormality detecting device at the time of an evaluation will be described. The abnormality detecting device acquires evaluation target data from the EV. An equation (3) represents evaluation target data "d." The evaluation target data "d" correspond to "operation log data" that include measured data of multiple items related to the operation of the EV. It is assumed that the multiple items included in the data "d" are the same as the multiple items included in the data D.

Equation (3)

$$d = (d_1, d_2, \ldots, d_m^{\rightarrow}) \quad (3)$$

The abnormality detecting device detects an abnormality based on measured values of two items adopted as the monitoring target items from the evaluation target data "d." In the descriptions herein below, the measured values of the two items adopted as the monitoring target items will be simply referred to as the measured values of the monitoring target items. It is assumed that the measured values of the monitoring target items are $d_{j1}$ and $d_{j2}$. When the condition represented in an equation (4) is satisfied, the linearity collapses, and the abnormality detecting device detects an abnormality. Here, $|d_{j1} - d_{j2}|$ refers to the distance between $d_{j1}$ and $d_{j2}$.

Equation (4)

$$|d_{j1} - d_{j2}| > \delta_{j1,j2} \quad (4)$$

The abnormality detecting device acquires the evaluation target data "d" from the EV at predetermined time intervals, and repeats the process described above. Further, when multiple monitoring target items are learned, an abnormality is detected based on measured values of each monitoring target item.

As described above, with the monitoring target items that have the linear relationship in the normal state, the abnormality detecting device according to the present embodiment detects an abnormality of the battery of the EV when the evaluation target data that correspond to the monitoring target items do not satisfy the linear relationship. As a result, the accuracy of abnormality detection may be improved.

Here, the abnormality detecting device may adopt first, second, and third monitoring target items to be described below, as the monitoring target items. The first, second, and third monitoring target items will be described.

The first monitoring target item represents two items which include a time when the driver steps on the throttle (accelerator) to the maximum in a state where the EV is stopped (full open time), and electric energy (Wh) consumed during the full open time. When the EV is in the normal state, the full open time and the electric energy of the first monitoring target item have a linear relationship. The relationship between the full open time and the electric energy of the first monitoring target item corresponds to a "first relationship."

The second monitoring target item represents two items which include a time when the driver steps on the throttle to the maximum in a state where the EV is running (full open time), and electric energy consumed during the full open time. When the EV is in the normal state, the full open time and the electric energy of the second monitoring target item have a linear relationship. The relationship between the full open time and the electric energy of the second monitoring target item corresponds to a "second relationship."

The third monitoring target item represents two items which include a time required for a predetermined speed increase and electric energy consumed by the speed increase. For example, when the speed Vb (km/h) is a fixed value, a time when the speed changes from the speed Va to the speed (Va+Vb) correspond to the time required for the predetermined speed increase. The time and the electric energy of the third monitoring target item have a linear relationship. The relationship between the time and the electric energy of the third monitoring target item corresponds to a "third relationship."

The reason for using the first, second, and third monitoring target items will be described. When the driver steps on the accelerator of the EV to the maximum, the load on the battery becomes the largest. The graph G5 of FIG. 1 represents the relationship between the time when the driver steps on the accelerator of the EV to the maximum (full open time) and the consumed electric energy, when the EV is in the normal state.

Figure 1:
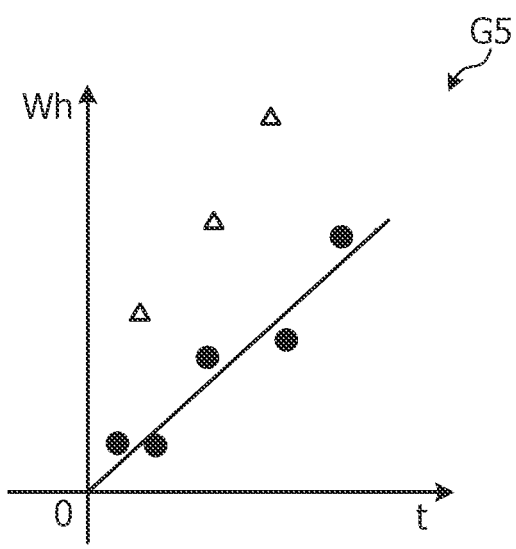
FIG. 1 is a view illustrating a relationship between a full open time and consumed electric energy.

FIG. 1 is a view illustrating the relationship between the full open time and the consumed electric energy. In the graph G5, the horizontal axis corresponds to time, and the vertical axis corresponds to electric energy. The circles represented in the graph G5 correspond to data in the normal state. Each triangle corresponds to data in the abnormal state. As illustrated in FIG. 1, when the EV is in the normal state, the relationship between the full open time and the electric energy is linear. The full open time corresponds to the time when the driver steps on the throttle to the maximum in a state where the EV is stopped, or the time when the driver steps on the throttle to the maximum in a state where the EV is running. Meanwhile, when an abnormality of a battery occurs, an excessive amount of current flows, and as a result, the electric energy increases, as compared with that in the normal state. The anomaly detecting device is able to detect the abnormality using the characteristics described in FIG. 1.

Further, although not illustrated, when the EV is in the normal state, the relationship between the time required for the predetermined speed increase and the electric energy consumed by the speed increase is also linear. That is, it may be said that an abnormality occurs in the battery of the EV, when the relationship between two specific items in the first, second, and third monitoring target items deviates from the linearity.

Figure 2:
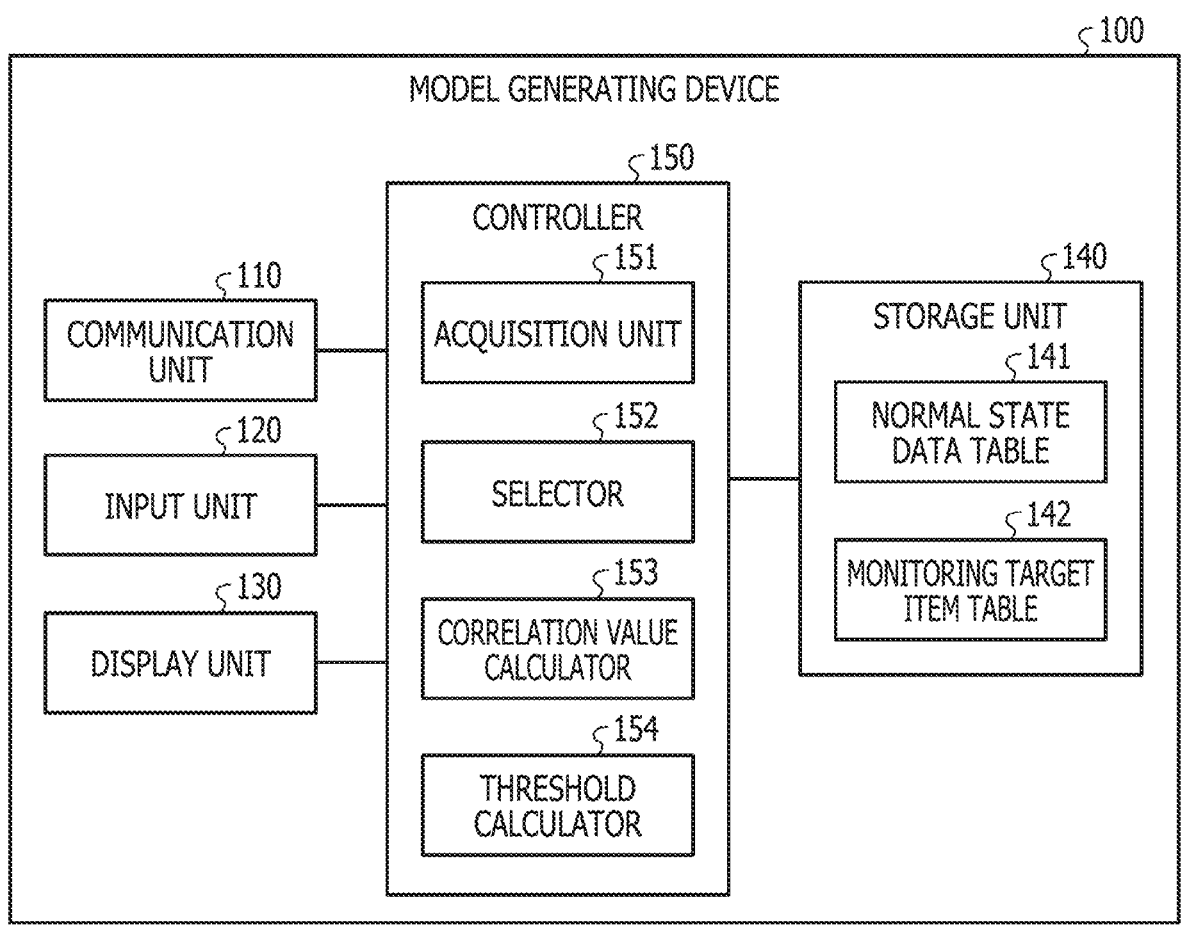
FIG. 2 is a functional block diagram illustrating a configuration of a model generating device according to an embodiment.

Next, an example of a configuration of a model generating device according to the present embodiment will be described. The model generating device corresponds to an abnormality detecting device that performs the process at the time of a learning as described above. FIG. 2 is a functional block diagram illustrating the configuration of the model generating device according to the present embodiment. As illustrated in FIG. 2, a model generating device 100 includes a communication unit 110, an input unit 120, a display unit 130, a storage unit 140, and a controller 150.

The communication unit 110 is a device that receives data from an external device or the like via a network. The communication unit 110 is an example of a communication device. The controller 150 to be described later may transmit/receive data to/from an external device by using the communication unit 110. For example, the communication unit 110 receives the data D of the EV in the normal state, from an external device or the like.

The input unit 120 is an input device that inputs various data to the controller 150 of the model generating device 100. The input unit 120 corresponds to a keyboard, a mouse, a touch panel or the like.

The display unit 130 is a display device that displays information output from the controller 150. The display unit 130 corresponds to an organic EL (electro luminescence) display, a liquid crystal display, a touch panel or the like.

The storage unit 140 includes a normal state data table 141 and a monitoring target item table 142. The storage unit 140 corresponds to a iii semiconductor memory element such as a RAM (random access memory), a flash memory or the like, or a storage device such as an HDD (hard disk drive) or the like.

The normal state data table 141 holds the data D in the normal state. The data D in the normal state are defined by the equation (1). The measured value di at a certain timing that is included in the data D is defined by the equation (2). The "n" refers to the number of measured values. The "m~" refers to the number of items.

For example, the multiple items included in the measured value di represented by the equation (2) include items related to the running of the EV, such as a voltage, current, an odometer, an engine rotation speed and others. Further, when the same EV is provided with multiple batteries, and when the same control is conducted on the multiple batteries, the multiple items may include a voltage of each battery.

Further, the multiple items include an item of a first full open time, an item of first electric energy, an item of a second full open time, an item of second electric energy, an item of a time required for a predetermined speed increase, and an item of third electric energy.

The first full open time represents the time when the driver steps on the throttle to the maximum in a state where the EV is stopped. The first electric energy represents the electric energy consumed during the first full open time.

The second full open time represents the time when the driver steps on the throttle to the maximum in a state where the EV is running. The second electric energy represents the electric energy consumed during the second full open time.

For example, when the speed Vb (km/h) is a fixed value, the time when the speed changes from the speed Va to the speed (Va+Vb) corresponds to the time required for the predetermined speed increase. The third electric energy corresponds to the electric energy consumed by the speed increase.

The monitoring target item table 142 holds data related to a monitoring target item. FIG. 3 is a view illustrating an example of a data structure of the monitoring target item table. As illustrated in FIG. 3, the monitoring target item table 142 associates an item number, monitoring target items, and a threshold with each other. The item number identifies each record in the monitoring target item table 142. The monitoring target items represent two items of which measured values have a correlation value equal to or higher than a predetermined correlation value in the normal state. The threshold represents a threshold calculated based on a correlation value of monitoring target items.

It is assumed that the monitoring target items in the monitoring target item table 142 include the first, second, and third monitoring target items.

Descriptions will be made while referring back to FIG. 2. The controller 150 includes an acquisition unit 151, a selector 152, a correlation value calculator 153, and a threshold calculator 154. The controller 150 may be implemented by a CPU (central processing unit), an MPU (micro processing unit) or the like. Further, the controller 150 may also be implemented by a hard-wired logic such as ASIC (application specific integrated circuit), an FPGA (field programmable gate array) or the like.

When the acquisition unit 151 acquires the data D in the normal state from the EV in the normal state, the acquisition unit 151 stores the acquired data D in the normal state data table 141. When the acquisition unit 151 acquires multiple data D, the acquisition unit 151 may merge the data D with each other.

The selector 152 selects two items from the m~ number of items, and outputs the two selected items to the correlation value calculator 153. In the descriptions hereinafter, the two items selected by the selector 152 will be referred to as "selected items." When information is acquired from the correlation value calculator 153 indicating that the correlation value of the selected items is equal to or higher than a predetermined correlation value $r_{th}$, the selector 152 adopts the selected items as "monitoring target items." Further, the selector 152 acquires the threshold δ that corresponds to the monitoring target items, from the threshold calculator 154. The selector 152 associates the monitoring target items with the threshold δ, and registers the monitoring target items and the threshold δ in the monitoring target item table 142.

The selector 152 repeats the process described above, for all combinations of two items among the entire items.

The correlation value calculator 153 is a processor that acquires measured values at each timing that correspond to the selected items, from the normal state data table 141, and calculates a correlation value. While the correlation value calculator 153 may calculate a correlation value by any process, the correlation value calculator 153 may calculate a correlation coefficient based on measured values at each timing that correspond to the selected items as a correlation value.

For example, when the selected items are items $j_1$ and $j_2$, the correlation value calculator 153 calculates a correlation coefficient (correlation value) based on a measured value of the item $j_1$ at each timing and a measured value of the item $j_2$ at each timing.

When the calculated correlation value is equal to or higher than the predetermined correlation value $r_{th}$ that is set in advance, the correlation value calculator 153 outputs information indicating that the correlation value of the selected items is equal to or higher than the predetermined correlation value $r_{th}$, to the selector 152. Further, when the calculated correlation value is equal to or higher than the predetermined correlation value $r_{th}$ that is set in advance, the correlation value calculator 153 outputs the selected items to the threshold calculator 154. When the correlation value is equal to or higher than the predetermined correlation value $r_{th}$ that is set in advance, the relationship between the selected items (two items) is linear.

The threshold calculator 154 is a processor that calculates a threshold δ for determining the linearity of the selected items (monitoring target items) when the selected items are acquired. For example, the threshold calculator 154 performs the process of calculating a correlation value for the selected items, multiple times at different timings. The threshold calculator 154 calculates the variance a of the multiple correlation values. The threshold calculator 154 calculates "3×σ" as a threshold δ.

For example, when the monitoring target items are the items $j_1$ and $j_2$, and when the variance based on the correlation value of the items $j_1$ and $j_2$ is $\sigma_{j_1,j_2}$, the threshold calculator 154 calculates the threshold of the monitoring target items to be $\delta_{j_1,j_2} = 3\sigma_{j_1,j_2}$. The threshold calculator 154 outputs the calculated threshold δ to the selector 152.

In the example described above, the threshold calculator 154 calculates the threshold δ of the monitoring target items. However, an administrator may operate the input unit 120 so as to set a threshold that corresponds to each monitoring target item, in the monitoring target item table 142.

Figure 4:
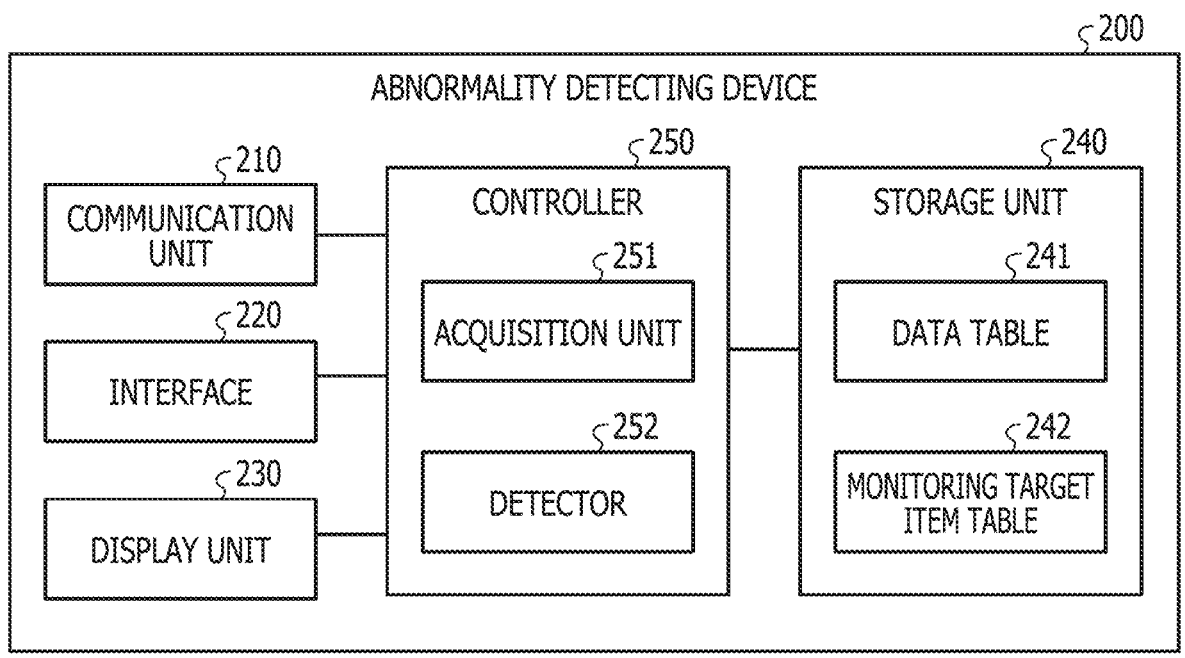
FIG. 4 is a functional block diagram illustrating a configuration of an abnormality detecting device according to the embodiment.

Next, an example of a configuration of the abnormality detecting device according to the present embodiment will be described. FIG. 4 is a functional block diagram illustrating the configuration of the abnormality detecting device according to the present embodiment. As illustrated in FIG. 4, an abnormality detecting device 200 includes a communication unit 210, an interface unit 220, a display unit 230, a storage unit 240, and a controller 250. Meanwhile, the abnormality detecting device 200 has the function of the model generating device 100 described above, and may generate the monitoring target item table 142.

The communication unit 210 is a device that receives data from the model generating device 100, an external device or the like via a network. The communication unit 210 is an example of a communication device. For example, the communication unit 210 receives data of the monitoring target item table 142 from the model generating device 100.

The interface unit 220 is a processor that receives an input of evaluation target data from a control device related to the running of the EV. The evaluation target data are defined by the equation (3). The interface unit 220 outputs the evaluation target data, to the controller 250.

The display unit 230 is a display device that displays information output from the controller 250. The display unit 130 corresponds to an organic EL display, a liquid crystal display, a touch panel or the like.

The storage unit 240 includes a data table 241 and a monitoring target item table 242. The storage unit 240 corresponds to a semiconductor memory element such as a RAM, a flash memory or the like, or a storage device such as an HDD or the like.

The data table 241 is a table that holds evaluation target data.

The monitoring target item table 242 holds data related to monitoring target items. Descriptions of the monitoring target item table 242 are the same as those of the monitoring target item table 142 described in FIG. 3.

The controller 250 includes an acquisition unit 251 and a detector 252. The controller 250 may be implemented by a CPU, an MPU or the like. Further, the controller 250 may also be implemented by a hard-wired logic such as an ASIC, an FPGA or the like.

When the acquisition unit 251 acquires data of the monitoring target item table 242 from the model generating device 100, the acquisition unit 251 registers the monitoring target item table 242 in the storage unit 240. When the acquisition unit 251 acquires evaluation target data via the interface unit 220, the acquisition unit 251 registers the evaluation target data in the data table 241.

The detector 252 is a processor that detects an abnormality from the evaluation target data to be stored in the data table 241. Hereinafter, an example of the process performed by the detector 252 will be described. The detector 252 selects monitoring target items from the monitoring target item table 242, and acquires a threshold $\delta$ that corresponds to the selected monitoring target items.

The detector 252 determines whether measured values of monitoring target items among the items of the evaluation target data "d" satisfy the condition represented in the equation (4). When the measured values of the monitoring target items satisfy the condition represented in the equation (4), the detector 252 detects an abnormality. When the condition represented in the equation (4) is satisfied, this means that the linearity of the monitoring target items (two items) is collapsing.

For example, in the example represented in the equation (4), when the distance between each measured value of the item $d_{j1}$ and each measured value of the item $d_{j2}$ is larger than the threshold $\delta_{j1,j2}$, the linearity of the items $d_{j1}$ and $d_{j2}$ is collapsing, and the detector 252 detects an abnormality of the battery. When the abnormality is detected, the detector 252 may display a warning screen for prompting the replacement of the battery on the display unit 230.

When multiple monitoring target items are registered in the monitoring target item table 242, the detector 252 repeats the process described above for each monitoring target item. Meanwhile, the administrator may refer to the monitoring target item table 242 so as to set the priority for each monitoring target item. When the priority is set for each monitoring target item, the detector 252 may perform the process described above for a monitoring target item with the relatively high priority.

For example, the detector 252 may preferentially perform the process described above for the first, second, and third monitoring target items, and may detect an abnormality for any one of the monitoring target items, when the condition represented in the equation (4) is satisfied.

Figure 5:
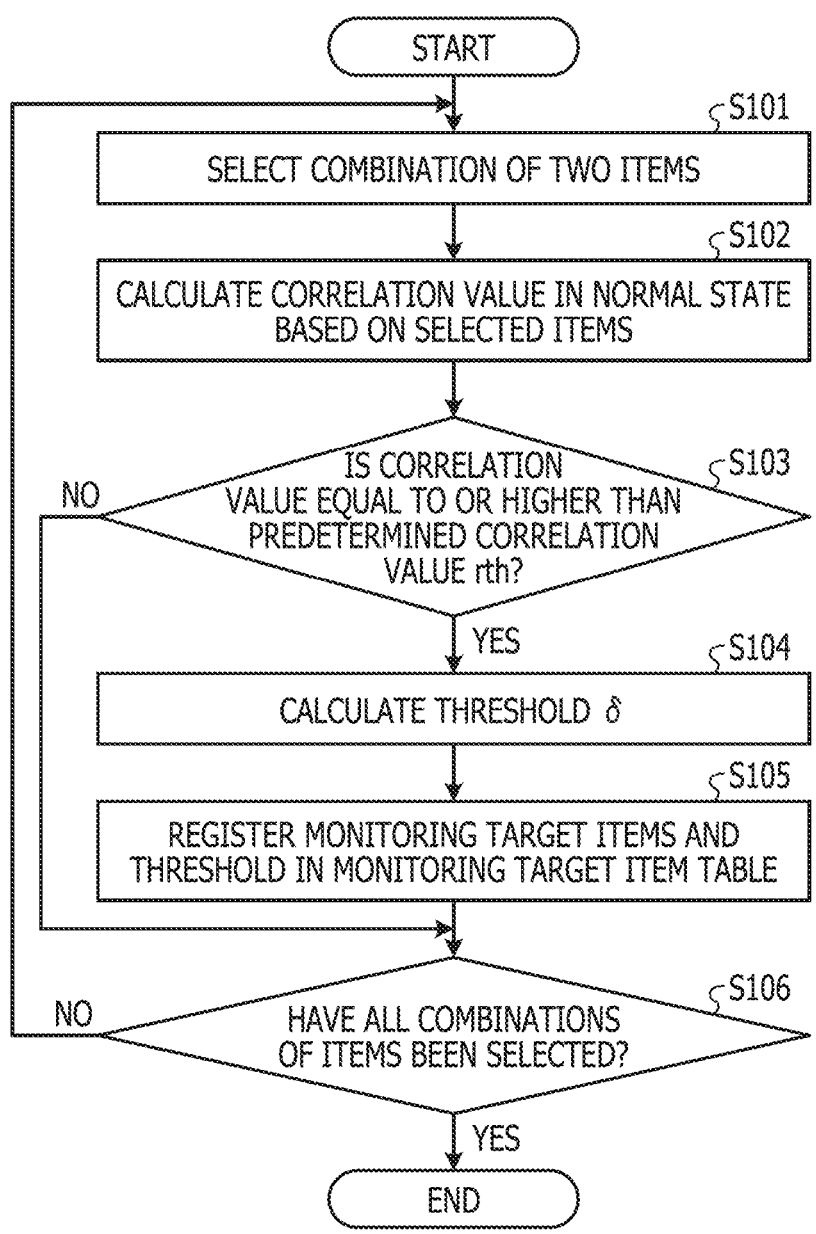
FIG. 5 is a flowchart illustrating a procedure of a process performed by a model generating device according to the embodiment.

Next, an example of the procedure of the process performed by the model generating device 100 will be described. FIG. 5 is a flowchart illustrating the procedure of the process performed by the model generating device according to the present embodiment. As illustrated in FIG. 5, the selector 152 of the model generating device 100 selects a combination of two items (step S101).

The correlation value calculator 153 of the model generating device 100 calculates a correlation value in the normal state based on the selected items (step S102). When the correlation value is not equal to or higher than the predetermined correlation value $r_{th}$ (step S103, No), the correlation value calculator 153 proceeds with step S106. Meanwhile, when the correlation value is equal to or higher than the predetermined correlation value $r_{th}$ (step S103, Yes), the correlation value calculator 153 proceeds with step S104.

The threshold value calculator 154 of the model generating device 100 calculates a threshold $\delta$ (step S104). The selector 152 registers the monitoring target items and the threshold in the monitoring target item table 142 (step S105).

When all combinations of two items have not yet been selected (step S106, No), the model generating device 100 proceeds with step S101. When all combinations of two items have been selected (step S106, Yes), the model generating device 100 ends the process.

Meanwhile, in the example illustrated in FIG. 5, the model generating device 100 generates the monitoring target item table 142 based on the data D in the normal state. However, the present disclosure is not limited thereto. For example, the abnormality detecting device 200 may have the functions of the acquisition unit 151, the selector 152, the correlation value calculator 153, and the threshold calculator 154. In this case, the abnormality detecting device 200 may generate the monitoring target item table 142 according to the procedure of the process described in FIG. 5.

Figure 6:
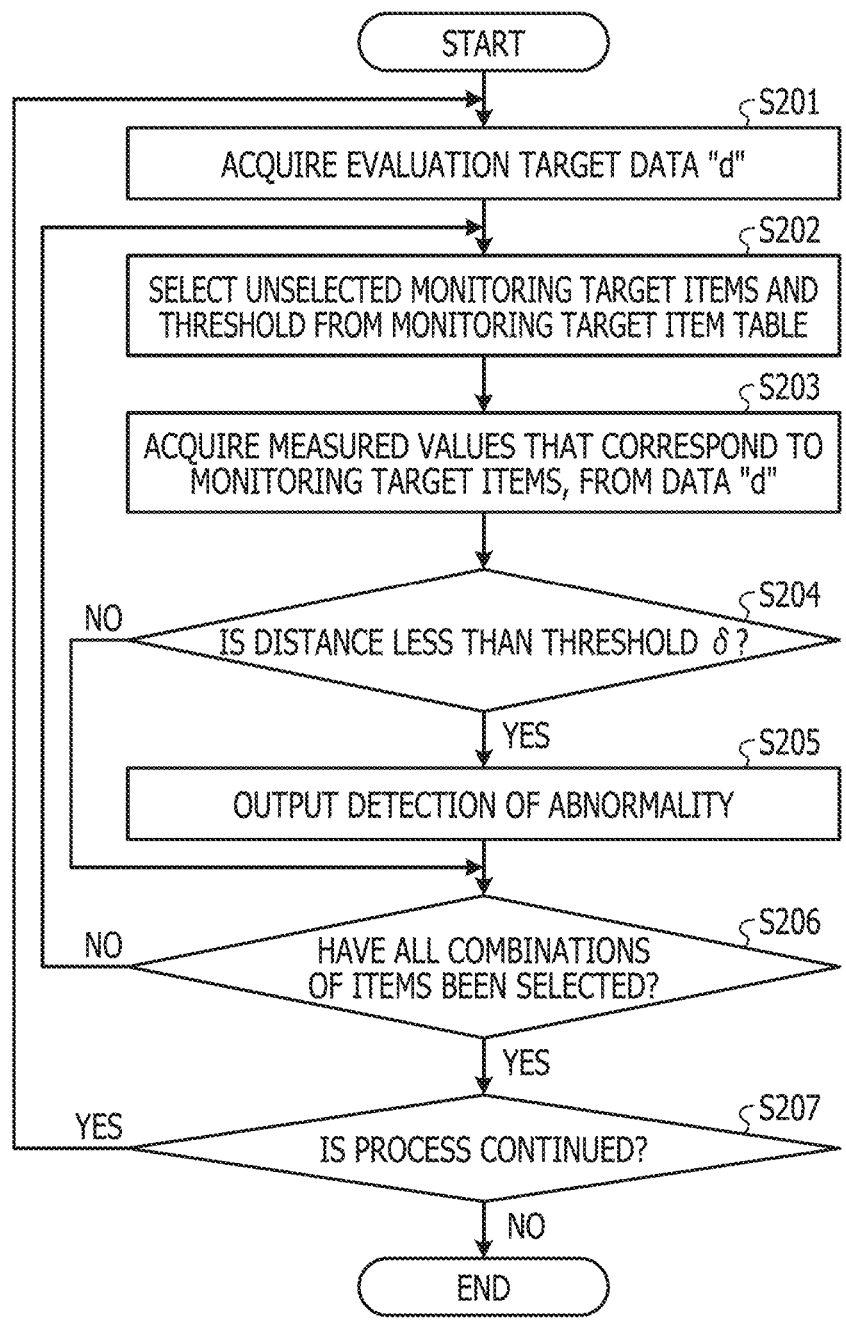
FIG. 6 is a flowchart illustrating a procedure of a process performed by the abnormality detecting device according to the embodiment.

Subsequently, an example of the procedure of the process performed by the abnormality detecting device 200 will be described. FIG. 6 is a flowchart illustrating the procedure of the process performed by the abnormality detecting device according to the present embodiment. As illustrated in FIG. 6, the acquisition unit 251 of the abnormality detecting device 200 acquires the evaluation target data "d" (step S201).

The detector 252 of the abnormality detecting device 200 selects unselected monitoring target items and a threshold δ from the monitoring target item table 142 (step S202). The detector 252 acquires measured values that correspond to the monitoring target items, from the data "d" (step S203).

For example, in the example represented in the equation (4), when the distance between each measurement value of the item $d_{j1}$ and each measurement value of the item $d_{j2}$ is smaller than the threshold δ (step S204, No), the detector 252 proceeds with step S206. Meanwhile, when the distance between each measured value of the item $d_{j1}$ and each measured value of the item $d_{j2}$ is larger than the threshold δ (step S204, Yes), the detector 252 outputs the detection of an abnormality (step S205).

When all of the monitoring target items have not yet been selected (step S206, No), the detector 252 proceeds with step S202. When all of the monitoring target items have been selected (step S206, Yes), the detector 252 proceeds with step S207.

When the process is continued (step S207, Yes), the abnormality detecting device 200 proceeds with step S201. Meanwhile, when the process is not continued (step S207, No), the abnormality detecting device 200 ends the process.

Next, effects of the abnormality detecting device 200 according to the present embodiment will be described. With the monitoring target items (two items) that have the linear relationship in the normal state of the EV, the abnormality detecting device 200 detects an abnormality of the battery of the EV when evaluation target data that correspond to monitoring target items do not satisfy the linear relationship. As a result, the accuracy of abnormality detection may be improved, as compared with a case where the abnormality detection is performed with one item such as a voltage.

The abnormality detecting device 200 (the model generating device 100) calculates the variance of the correlation value of the monitoring target items, and calculates the threshold δ of the monitoring target items based on the calculated variance. As a result, the abnormality detecting device 200 may specify whether the relationship of the monitoring target items is linear, for each monitoring target item.

The abnormality detecting device 200 uses the first, second, and third monitoring target items as the monitoring target items. The first, second, and third monitoring target items have the linear relationship when the EV is in the normal state, and any of the first, second, and third monitoring target items may include two specific items of which linearity collapses when an abnormality occurs in the battery. Thus, the abnormality detecting device detects an abnormality when the relationship of two items in any one of the first, second, and third monitoring target items deviates from the linearity (when the condition of the equation (4) is satisfied), so that the accuracy of abnormality detection may be improved.

Meanwhile, in the present embodiment, the model generation device 100 calculates the threshold δ for determining the linearity of the monitoring target items. However, the present disclosure is not limited thereto. The threshold calculator 154 of the model generating device 100 may generate a linear regression model by the least-square method from measured values of monitoring target items, and register the linear regression model in the monitoring target item table 142. At the time of an evaluation, the abnormality detecting device 200 calculates a difference between the measured values of the monitoring target items and the linear regression model, and detects an abnormality when the difference becomes equal to or higher than a threshold.

Figure 7:
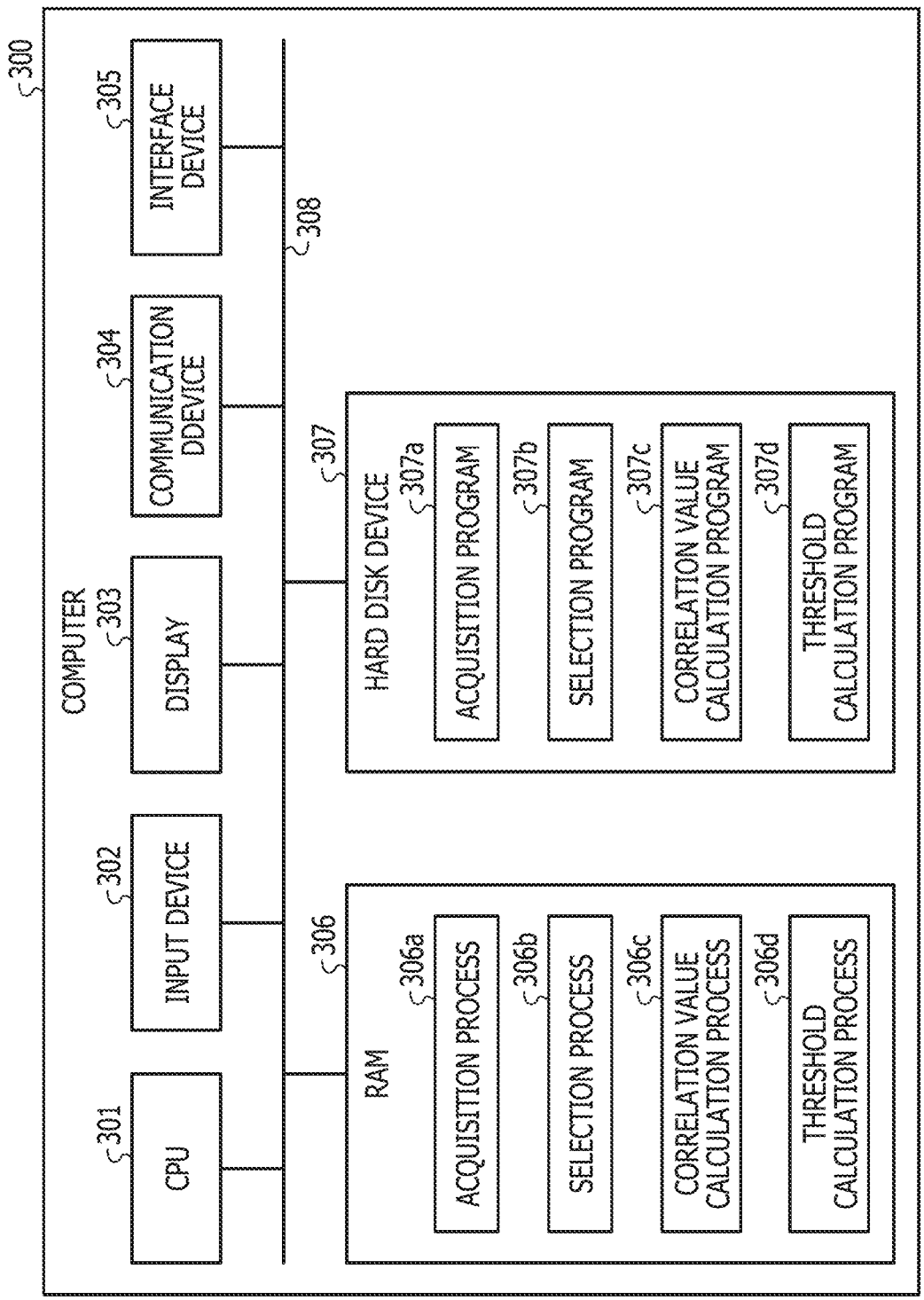
FIG. 7 is a view illustrating an example of a hardware configuration of a computer that implements the same function as that of the model generating device according to the embodiment.

Next, an example of a hardware configuration of a computer (information processing apparatus) that implements the same functions as those of the model generating device 100 according to the embodiment described above. FIG. 7 is a view illustrating an example of the hardware configuration of the computer that implements the same functions as those of the model generating device according to the embodiment.

As illustrated in FIG. 7, a computer 300 includes a CPU 301 that executes various arithmetic processes, an input device 302 that receives an input of data from a user, and a display 303. Further, the computer 300 includes a communication device 304 that transmits/receives data to/from an external device or the like via a wired or wireless network, and an interface device 305 that accesses another device to perform the exchange of data. Further, the computer 300 includes a RAM 306 that temporarily stores various types of information, and a hard disk device 307. Each of the devices 301 to 307 is connected to a bus 308.

The hard disk device 307 includes an acquisition program 307a, a selection program 307b, a correlation value calculation program 307c, and a threshold calculation program 307d. Further, the CPU 301 reads each of the programs 307a to 307d, and deploys the read program in the RAM 306.

The acquisition program 307a functions as an acquisition process 306a. The selection program 307b functions as a selection process 306b. The correlation value calculation program 307c functions as a correlation value calculation process 306c. The threshold calculation program 307d functions as a threshold calculation process 306d.

The acquisition process 306a corresponds to the process performed by the acquisition unit 151. The selection process 306b corresponds to the process performed by the selector 152. The correlation value calculation process 306c corresponds to the process performed by the correlation value calculator 153. The threshold calculation process 306d corresponds to the process performed by the threshold calculator 154.

Meanwhile, the programs 307a to 307d may not necessarily be stored in the hard disk device 307 from the beginning. For example, each program may be stored in a "portable physical medium" such as a flexible disk (FD), a CD-ROM, a DVD, a magneto-optical disk, an IC card or the like which is inserted into the computer 300. Then, the computer 300 may read and execute each of the programs 307a to 307d.

Figure 8:
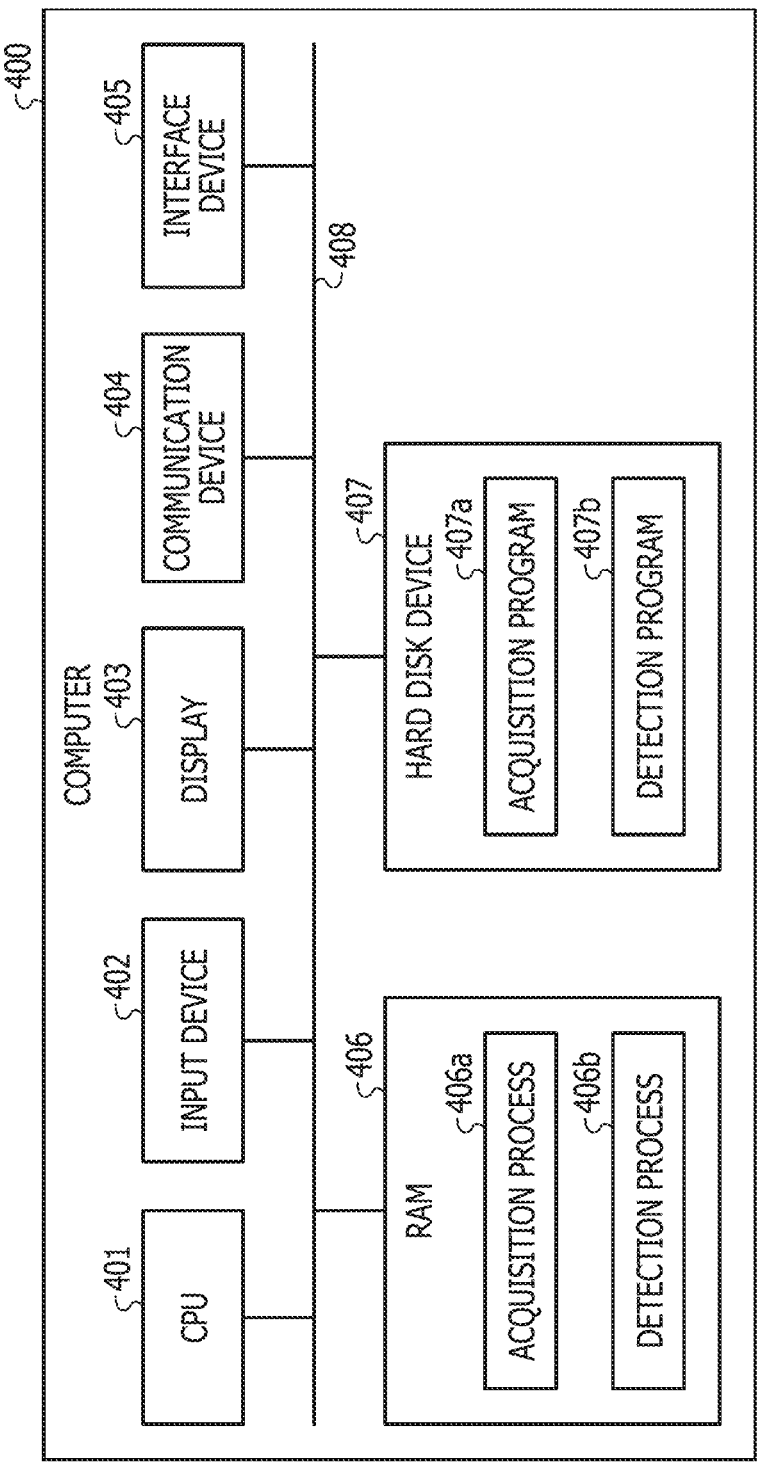
FIG. 8 is a view illustrating an example of a hardware configuration of a computer that implements the same function as that of the abnormality detecting device according to the embodiment.

Next, an example of a hardware configuration of a computer that implements the same functions as those of the abnormality detecting device according to the embodiment described above. FIG. 8 is a view illustrating an example of the hardware configuration of the computer that implements the same functions as those of the abnormality detecting device according to the embodiment.

As illustrated in FIG. 8, a computer 400 includes a CPU 401 that executes various arithmetic processes, an input device 402 that receives an input of data from a user, and a display 403. Further, the computer 400 includes a communication device 404 that transmits/receives data to/from an external device or the like via a wired or wireless network, and an interface device 405 that accesses another device to perform the exchange of data. Further, the computer 400 includes a RAM 406 that temporarily stores various types of information, and a hard disk device 407. Each of the devices 401 to 407 is connected to a bus 408.

The hard disk device 407 includes an acquisition program 407a and a detection program 407b. Further, the CPU 401 reads each of the programs 407a and 407b, and deploys the read program in the RAM 406.

The acquisition program 407a functions as an acquisition process 406a. The detection program 407b functions as a detection process 406b.

The acquisition process 406a corresponds to the process performed by the acquisition unit 251. The detection process 406b corresponds to the process performed by the detector 252.

Meanwhile, the programs 407a and 407b may not necessarily be stored in the hard disk device 407 from the beginning. For example, each program is stored in a "portable physical medium" such as a flexible disk (FD), a CD-ROM, a DVD, a magneto-optical disk, an IC card or the like which is inserted into the computer 400. Then, the computer 400 may read and execute each of the programs 407a and 407b.

According to an aspect of the embodiments, the accuracy of abnormality detection may be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of detecting abnormality, the method comprising:
    acquiring, by a computer, operation log data that include measured data of a plurality of items related to an operation of a mobile object that is electrically driven, the plurality of items including a first measured data of a first parameter related to the operation of the mobile object, a second measured data of a second parameter, different from the first parameter, related to the operation of the mobile object, and a third measured data of a third parameter, different from the first and second parameters, related to the operation of the mobile object, wherein the first measured data has a first linear relationship in a normal state of the mobile object with the second measured data and the second measured data has a second linear relationship, different from the first linear relationship, in the normal state of the mobile object with the third measured data; and
    determining, based on the operation log data, that an abnormality occurs in the mobile object when at least one of the first linear relationship and the second linear relationship is not satisfied.

2. The method according to claim 1, wherein
    the first measured data is measured data of a throttle operation, the second measured data is measured data measured data of electric energy, and a third measured data is measured data of a speed, and
    the method further comprises:
    determining that an abnormality occurs in the mobile object, upon determining that specific measured data do not satisfy any one of the first linear relationship, the second linear relationship, and a third linear relationship, the first linear relationship is between a first full open time and first electric energy, the first full open time being a full open time of the throttle in a state where the mobile object is stopped, the first electric energy being consumed during the first full open time, the third linear relationship is between a second full open and second electric energy, the second full open time being a full open time of the throttle in a state where the mobile object is running, the second electric energy being consumed during the second full open time, the second linear relationship is between a time required for a predetermined speed increase and third electric energy, the third electric energy being consumed by the speed increase.

3. The method according to claim 2, further comprising:
    calculating a threshold based on a correlation value of the first foil open time and the first electric energy at the time of a normal operation of the mobile object; and
    determining that measured data of the first full open time and measured data of the first electric energy do not satisfy the first linear relationship when a distance between the measured data of the first full open time and the measured data of the first electric energy is equal to or higher than the threshold.

4. The method according to claim 2, further comprising:
    calculating a threshold based on a correlation value of the second full open time and the second electric energy at the time of a normal operation of the mobile object; and
    determining that measured data of the second full open time and measured data of the second electric energy do not satisfy the third linear relationship when a distance between the measured data of the second full open time and the measured data of the second electric energy is equal to or higher than the threshold.

5. The method according to claim 2, further comprising:
    calculating a threshold based on a correlation value of the time required for the predetermined speed increase and the third electric energy at the time of a normal operation of the mobile object; and
    determining that measured data of the time required for the predetermined speed increase and measured data of the third electric energy do not satisfy the second linear relationship when a distance between the measured data of the time required for the predetermined speed increase and the measured data of the third electric energy is equal to or higher than the threshold.

6. A non-transitory computer-readable recording medium having stored therein a program that causes a computer to execute a process, the process comprising:
    acquiring operation log data that include measured data of a plurality of items related to an operation of a mobile object that is electrically driven, the plurality of items including a first measured data of a first parameter related to the operation of the mobile object, a second measured data of a second parameter, different from the first parameter, related to the operation of the mobile object, and a third measured data of a third parameter, different from the first and second parameters, related to the operation of the mobile object, wherein the first measured data has a first linear relationship in a normal state of the mobile object with the second measured data and the second measured data has a second linear relationship, different from the first linear relationship, in the normal state of the mobile object with the third measured data; and
    determining, based on the operation log data, that an abnormality occurs in the mobile object when at least one of the first linear relationship and the second linear relationship is not satisfied.

7. The non-transitory computer-readable recording medium according to claim 6, wherein
the first measured data is measured data of a throttle operation, the second measured data is measured data measured data of electric energy, and a third measured data is measured data of a speed, and
the process further comprises:
determining that an abnormality occurs in the mobile object, upon determining that specific measured data do not satisfy any one of the first linear relationship, the second linear relationship, and a third linear relationship, the first linear relationship is between a first full open time and first electric energy, the first full open time being a full open time of the throttle in a state where the mobile object is stopped, the first electric energy being consumed during the first full open time, the third linear relationship is between a second full open time and second electric energy, the second full open time being a full open time of the throttle in a state where the mobile object is running, the second electric energy being consumed during the second full open time, the second linear relationship is between a time required for a predetermined speed increase and third electric energy, the third electric energy being consumed by the speed increase.

8. The method according to claim 7, the process further comprising:
calculating a threshold based on a correlation value of the first full open time and the first electric energy at the time of a normal operation of the mobile object; and
determining that measured data of the first full open time and measured data of the first electric energy do not satisfy the first linear relationship when a distance between the measured data of the first full open time and the measured data of the first electric energy is equal to or higher than the threshold.

9. The method according to claim 7, the process further comprising:
calculating a threshold based on a correlation value of the second full open time and the second electric energy at the time of a normal operation of the mobile object; and
determining that measured data of the second full open time and measured data of the second electric energy do not satisfy the third linear relationship when a distance between the measured data of the second full open time and the measured data of the second electric energy is equal to or higher than the threshold.

10. The method according to claim 7, the process further comprising:
calculating a threshold based on a correlation value of the time required for the predetermined speed increase and the third electric energy at the time of a normal operation of the mobile object; and
determining that measured data of the time required for the predetermined speed increase and measured data of the third electric energy do not satisfy the second linear relationship when a distance between the measured data of the time required for the predetermined speed increase and the measured data of the third electric energy is equal to or higher than the threshold.

11. An information processing apparatus, comprising:
a memory; and
a processor coupled to the memory and the processor configured to:
acquire operation log data that include measured data of a plurality of items related to an operation of a mobile object that is electrically driven, the plurality of items including a first measured data of a first parameter related to the operation of the mobile object, a second measured data of a second parameter, different from the first parameter, related to the operation of the mobile object, and a third measured data of a third parameter, different from the first and second parameters, related to the operation of the mobile object, wherein the first measured data has a first linear relationship in a normal state of the mobile object with the second measured data and the second measured data has a second linear relationship, different from the first linear relationship, in the normal state of the mobile object with the third measured data; and
determine, based on the operation log data, that an abnormality occurs in the mobile object when at least one of the first linear relationship and the second linear relationship is not satisfied.

12. The information processing apparatus according to claim 11, wherein
the first measured data is measured data of a throttle operation, the second measured data is measured data measured data of electric energy, and a third measured data is measured data of a speed, and
the processor is further configured to:
determine that an abnormality occurs in the mobile object, upon determining that specific measured data do not satisfy any one of the first linear relationship, the second linear relationship, and a third linear relationship, the first linear relationship is between a first full open time and first electric energy, the first full open time being a full open time of the throttle in a state where the mobile object is stopped, the first electric energy being consumed during the first full open time, the third linear relationship is between a second full open time and second electric energy, the second full open time being a full open time of the throttle in a state where the mobile object is running, the second electric energy being consumed during the second full open time, the second linear relationship is between a time required for a predetermined speed increase and third electric energy, the third electric energy being consumed by the speed increase.

13. The information processing apparatus according to claim 12, wherein
the processor is further configured to:
calculate a threshold based on a correlation value of the first full open time and the first electric energy at the time of a normal operation of the mobile object; and
determine that measured data of the first full open time and measured data of the first electric energy do not satisfy the first linear relationship when a distance between the measured data of the first full open time and the measured data of the first electric energy is equal to or higher than the threshold.

14. The information processing apparatus according to claim 12, wherein
the processor is further configured to:
calculate a threshold based on a correlation value of the second full open time and the second electric energy at the time of a normal operation of the mobile object; and
determine that measured data of the second full open time and measured data of the second electric energy do not satisfy the third linear relationship when a distance between the measured data of the second full open time and the measured data of the second electric energy is equal to or higher than the threshold.

15. The information processing apparatus according to claim 12, wherein the processor is further configured to:

calculate a threshold based on a correlation value of the time required for the predetermined speed increase and the third electric energy at the time of a normal operation of the mobile object; and determine that measured data of the time required for the predetermined speed increase and measured data of the third electric energy do not satisfy the second linear relationship when a distance between the measured data of the time required for the predetermined speed increase and the measured data of the third electric energy is equal to or higher than the threshold.

* * * * *